(12) United States Patent
Lien et al.

(10) Patent No.: US 6,888,063 B1
(45) Date of Patent: May 3, 2005

(54) DEVICE AND METHOD FOR PROVIDING SHIELDING IN RADIO FREQUENCY INTEGRATED CIRCUITS TO REDUCE NOISE COUPLING

(75) Inventors: Wai-Yi Lien, Hsin-Chu (TW); Chung-Long Chang, Hsin-Chu (TW); Jyh-Chyurn Guo, Hsinchu (TW); John Chern, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/823,874

(22) Filed: Apr. 14, 2004

Related U.S. Application Data
(60) Provisional application No. 60/511,479, filed on Oct. 15, 2003.

(51) Int. Cl.[7] .............................................. H05K 9/00
(52) U.S. Cl. ..................... 174/35 R; 257/659; 361/818
(58) Field of Search ........................ 174/35 R; 257/659, 257/660; 361/816, 818

(56) References Cited

U.S. PATENT DOCUMENTS

| | | |
|---|---|---|
| 6,198,153 B1 | 3/2001 | Liu et al. |
| 6,278,148 B1 | 8/2001 | Watanabe et al. |
| 6,407,441 B1 | 6/2002 | Yuan |
| 6,627,507 B2 | 9/2003 | Yuan |
| 6,664,624 B2 * | 12/2003 | Haematsu ................... 257/700 |
| 6,667,480 B2 * | 12/2003 | Kajiwara et al. ...... 250/370.01 |
| 6,720,493 B1 * | 4/2004 | Strobel et al. ............ 174/35 R |
| 6,747,340 B2 * | 6/2004 | Barnes et al. ............... 257/659 |
| 6,765,806 B1 * | 7/2004 | Caldwell ..................... 361/816 |
| 6,822,279 B2 * | 11/2004 | Soeda ......................... 257/296 |
| 6,822,880 B2 * | 11/2004 | Kovacs et al. .............. 361/818 |
| 6,836,022 B2 * | 12/2004 | Boone et al. ............... 257/778 |

* cited by examiner

*Primary Examiner*—Dean A. Reichard
*Assistant Examiner*—Adolfo Nino
(74) *Attorney, Agent, or Firm*—Haynes and Boone, LLP

(57) ABSTRACT

Disclosed is a semiconductor radio frequency (RF) device having a shielding structure for minimizing coupling between RF passive components and conductive routing for active components. In one example, the device includes at least one shielding layer formed between the RF passive components and conductive routing. The shielding layer includes at least one opening. In another example, a second shielding layer may be used. The second shielding layer may also have an opening, and the openings in the first and second shielding layers may be offset from one another. The first and second shielding layers may be connected to each other through a guard ring, and may also be connected to a common voltage potential.

29 Claims, 10 Drawing Sheets

DEVICE AND METHOD FOR PROVIDING SHIELDING IN RADIO FREQUENCY INTEGRATED CIRCUITS TO REDUCE NOISE COUPLING

CROSS-REFERENCE

This application claims priority from U.S. Provisional Patent Application Ser. No. 60/511,479, filed on Oct. 15, 2003, and entitled "A DEVICE AND METHOD FOR PROVIDING SHIELDING IN RADIO FREQUENCY INTEGRATED CIRCUITS TO REDUCE NOISE COUPLING."

BACKGROUND

The present disclosure relates generally to the field of semiconductor integrated circuits and, more particularly, to a shielding layer that may be used to reduce noise coupling in such circuits.

Radio frequency (RF) components are often implemented with integrated circuits (ICs) used in areas such as wireless communications systems, including Global System for Mobile Communications (GSM); Digital Enhanced Cordless Telecommunications (DECT); Universal Mobile Telecommunications System (UMTS); and bluetooth. Each system may operate within a different frequency range, but all generally involve high frequency signals.

Among other components, RF circuits frequently utilize inductors for filtering, amplifying, and decoupling DC/AC signals, as well as in impedance matching and in the formation of resonant circuits used in radio-frequency applications. For frequencies below 100 Hz, discrete off-chip inductor components may be used because of the difficulty in integrating inductors having the needed high inductance values into an IC. However, with the increased speed of IC devices and the advancement in multilevel interconnection technologies, it is becoming increasingly common to incorporate other passive components, such as resistors and inductors into ICs.

In radio frequency integrate circuits (RF ICs), crosstalk (e.g., or interference between RF passive components and underlying interconnections) generally increases as signal frequency increases. To minimize such crosstalk, a shielding structure may be used to isolate various RE circuits and to prevent noise coupling between the RF passive components and the underlying interconnections and active devices. Currently, a single, uninterrupted layer of metal may be used as a shielding layer in an RFIC chip to isolate RE passive components from metal interconnect circuits. However, such a single, uninterrupted metal layer generally violates IC design rules and is a poor use of IC surface area. Furthermore, while fabricating RF circuits on a semiconductor substrate, chemical-mechanical polishing (CMP) of such a large surface area as that formed by the metal plate may cause a "dishing" effect in which the processed metal surface is dish shaped rather than flat.

Accordingly, what is needed is improved shielding for RFICs and a method for forming such shielding.

SUMMARY

The present disclosure relates to a semiconductor device having a substrate. In one embodiment, the device comprises an active circuit layer formed proximate to the semiconductor substrate, a passive RF layer, and a first shielding layer positioned between the active circuit layer and the passive RF layer, wherein the first shielding layer has a first opening formed therein.

In another embodiment, the semiconductor device further comprises a second shielding layer positioned between the active circuit layer and the component layer.

In still another embodiment, the semiconductor device further comprises a guard ring connected to both the first and second shielding layers.

In yet another embodiment, at least one of the first and second shielding layers is grounded or connected to a fixed voltage potential.

In another embodiment, the second shielding layer includes at least a second opening formed therein.

In still another embodiment, the second shielding layer includes at least a second opening formed therein.

In yet another embodiment, the second opening is offset from the first opening.

In another embodiment, a method for providing shielding in an integrated circuit formed on a substrate is described. The method comprises forming a first structural layer on the substrate, wherein the first structural layer comprises either metal routing or radio frequency passive (RF) components, forming a first shielding layer above the first structural layer, patterning the first shielding layer to form at least one opening in the first shielding layer, and forming a second structural layer above the first shielding layer, wherein the second structural layer comprises RF passive components if the first structural layer comprises metal routing, and wherein the second structural layer comprises metal routing if the first structural layer comprises RF passive components.

In yet another embodiment, the method further comprises forming a second shielding layer proximate to the first shielding layer, and patterning the second shielding layer to form at least one opening in the second shielding layer.

In still another embodiment, patterning the second shielding layer includes offsetting the second opening from the first opening.

BRIEF DESCRIPTION OF THE DRAWINGS

FIG. 1b illustrates one embodiment of a shielding layer that may be used in the RFIC of FIG. 1a.

FIG. 1c illustrates another embodiment of a shielding layer that may be used in the RFIC of FIG. 1a.

DETAILED DESCRIPTION

Figure 1A:
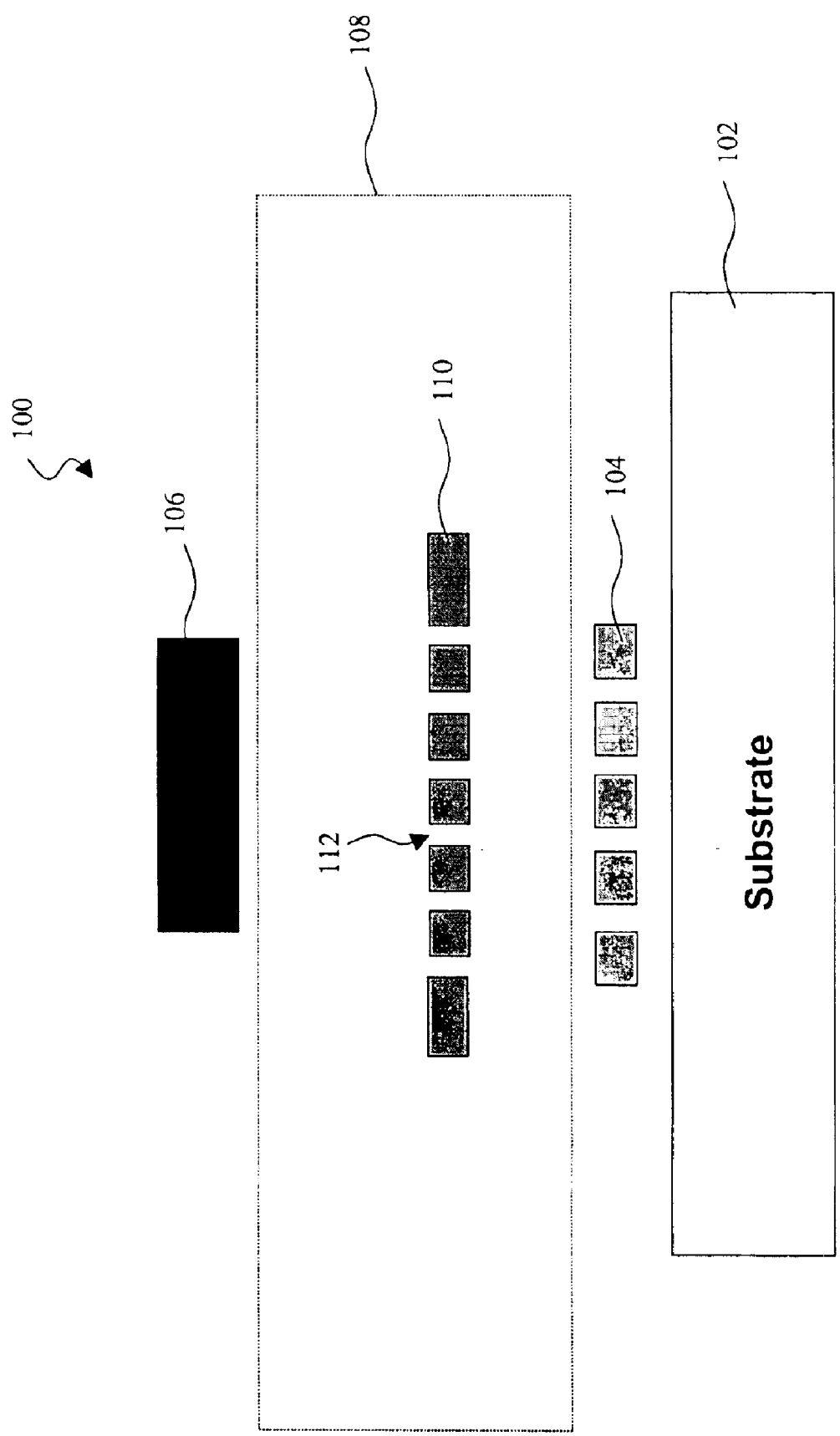
FIG. 1a illustrates a cross-sectional view of one embodiment of a radio frequency integrated circuit (RFIC) having a shielding layer.

The present disclosure relates generally to the field of semiconductor integrated circuits, more particularly, to a shielding layer that may be used to reduce noise coupling in such circuits. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1a, in one embodiment, a radio frequency integrated circuit (RFIC) 100 is illustrated that avoids using a single, uninterrupted metal layer, which is an inefficient use of space and may cause a dishing effect as previously described. The RFIC 100 compromises a semiconductor substrate 102, conductive routing 104 for active circuit components, RF passive components 106, and a RF shielding structure 108 positioned between the conductive routing 104 and the RF passive components 106.

The semiconductor substrate 102 may include an elementary semiconductor such as crystal silicon, polycrystalline silicon, amorphous silicon, germanium and diamond, a compound semiconductor such as SiC, GaAs, AlP, AlAs, AlSb, GaP, GaSb, InP, InAs, and InSb, or an alloy semiconductor such as SiGe, GaAsP, AlInAs, AlGaAs, or GaInP. Furthermore, the semiconductor substrate 102 may be a semiconductor on insulator, such as silicon on insulator (SOI), or a thin film transistor (TFT). In one example, the semiconductor substrate 102 may include a doped epi layer or a buried layer. In another example, a compound semiconductor substrate may be used and may further include a multiple silicon structure. In still another example, the semiconductor substrate 102 may be a silicon substrate and may further include a multilayer compound semiconductor structure. The semiconductor substrate may contain doped regions, patterned areas, devices, and circuits, such as bipolar transistors, metal-oxide-semiconductor field effect transistors (MOSFETs), and BiCMOS (bipolar and CMOS transistors).

The conductive routing 104 for active circuit components may include interconnections to underlying active devices in the semiconductor substrate 102. Such interconnections may be made from conductive materials such as copper, copper alloy, aluminum, aluminum alloy (Al—Cu—Si), titanium, titanium nitride, tantalum, tantalum nitride, tungsten, metal silicide, doped poly silicon, and carbon nanotubes.

The RF passive components 106 may comprise capacitive components, inductive components, and resistive components. A capacitive component may comprise two electrodes and a insulator layer between the two electrodes. Based on the materials used for the electrodes of the capacitors, capacitive components may be made using polysilicon-silicon, polysilicon-polycide, polysilicon-polysilicon, polysilicon-metal, or metal-metal capacitors. A capacitor insulator layer may be fabricated using high k material and/or low k material based on design considerations, and may be formed using tetraethylorthosilicate (TEOS), silicon oxynitride (SiON), silicon nitride ($Si_3N_4$), titanium oxide ($TiO_2$), tantalum pentoxide ($Ta_2O_5$), or barium strontium titanate (BST). The inductive components and resistive components may be made from conductive materials including copper, copper alloy, aluminum, aluminum alloy (Al—Cu—Si), titanium, titanium nitride, tantalum, tantalum nitride, tungsten, metal silicide, doped poly silicon, and carbon nanotubes.

Figure 1C:
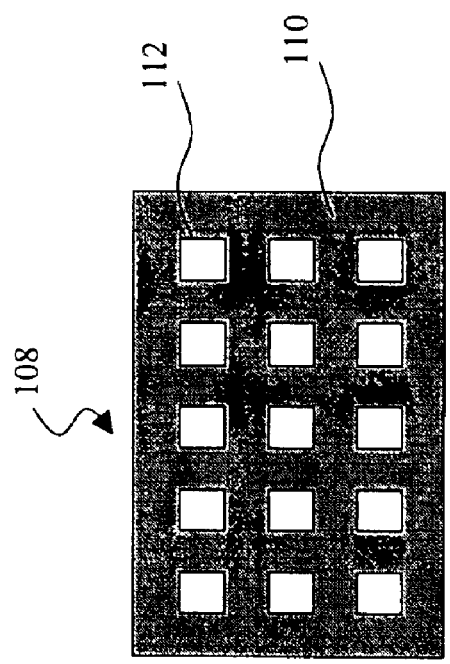
Figure 1B:
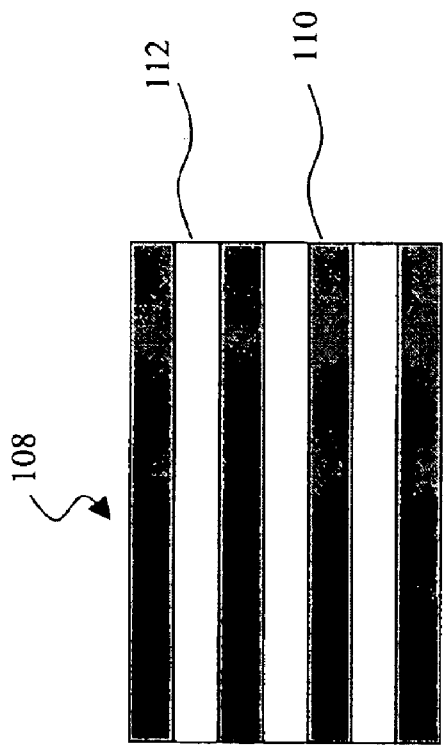

With additional reference to FIGS. 1b and 1c, the RF shielding structure 108 is positioned between the conductive routing 104 and the RF passive components 106 to minimize coupling between these two layers. In the present example, the RF shielding structure comprises a single shielding layer 110 formed using a metal or metal alloy, such as copper, copper alloy, aluminum, aluminum alloy (Al—Cu—Si), titanium, titanium nitride, tantalum, tantalum nitride, tungsten, tungsten nitride, or doped polysilicon. As illustrated in FIGS. 1b and 1c, the shielding layer 110 may also include multiple openings 112. Although the openings 112 may be of any shape (e.g., round, square, rectangle, etc.) and may be arranged to form any pattern (e.g., slotted lines, dotted lines, etc.), the present openings 112 form a plurality of strips across the shielding layer 110 (as illustrated in FIG. 1c). The openings 112 may be used, for example, to provide an area through which vertical interconnects may be placed to connect various circuit components that are above and below the shielding layer 110.

Figure 2:
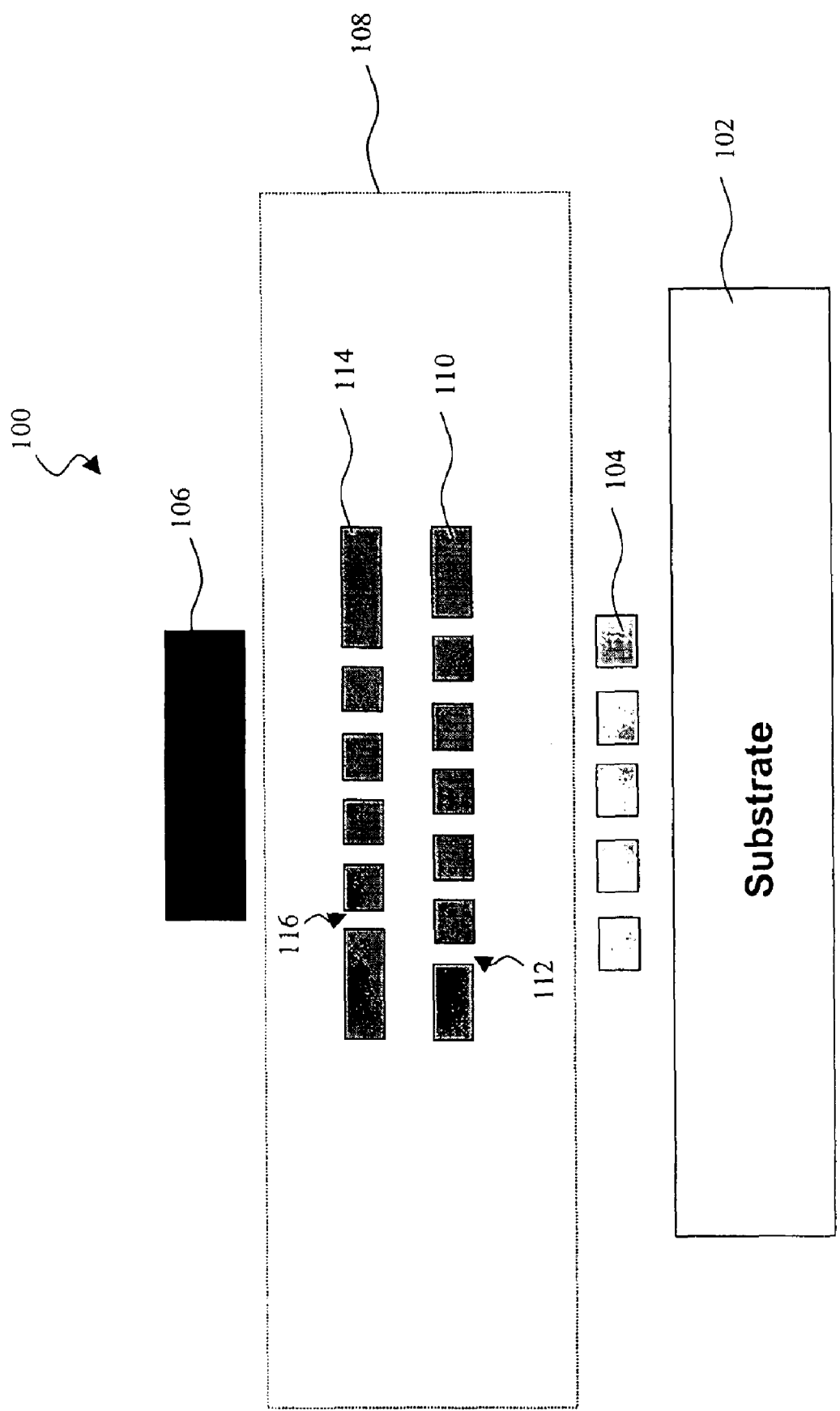
FIG. 2 illustrates a cross-sectional view of another embodiment of a RFIC having multiple shielding layers.

Referring now to FIG. 2, in another embodiment, the RF shielding structure 108 of FIG. 1a is illustrated with a second shielding layer 114. In the present example, each shielding layer 110, 114 includes multiple openings 112, 116, respectively. Although the openings 112, 116 may be of any shape and may be arranged to form any pattern, the present openings 112, 116, form a plurality of strips across each of their respective shielding layers 110, 114. However, as the openings 112, 116 may reduce the amount of shielding provided by each of the shielding layers 110 and 114, the openings of each shielding layer may be offset from the openings of the other shielding layer to create a grid pattern or a solid shield when viewed from a vertical orientation.

Figure 3A:
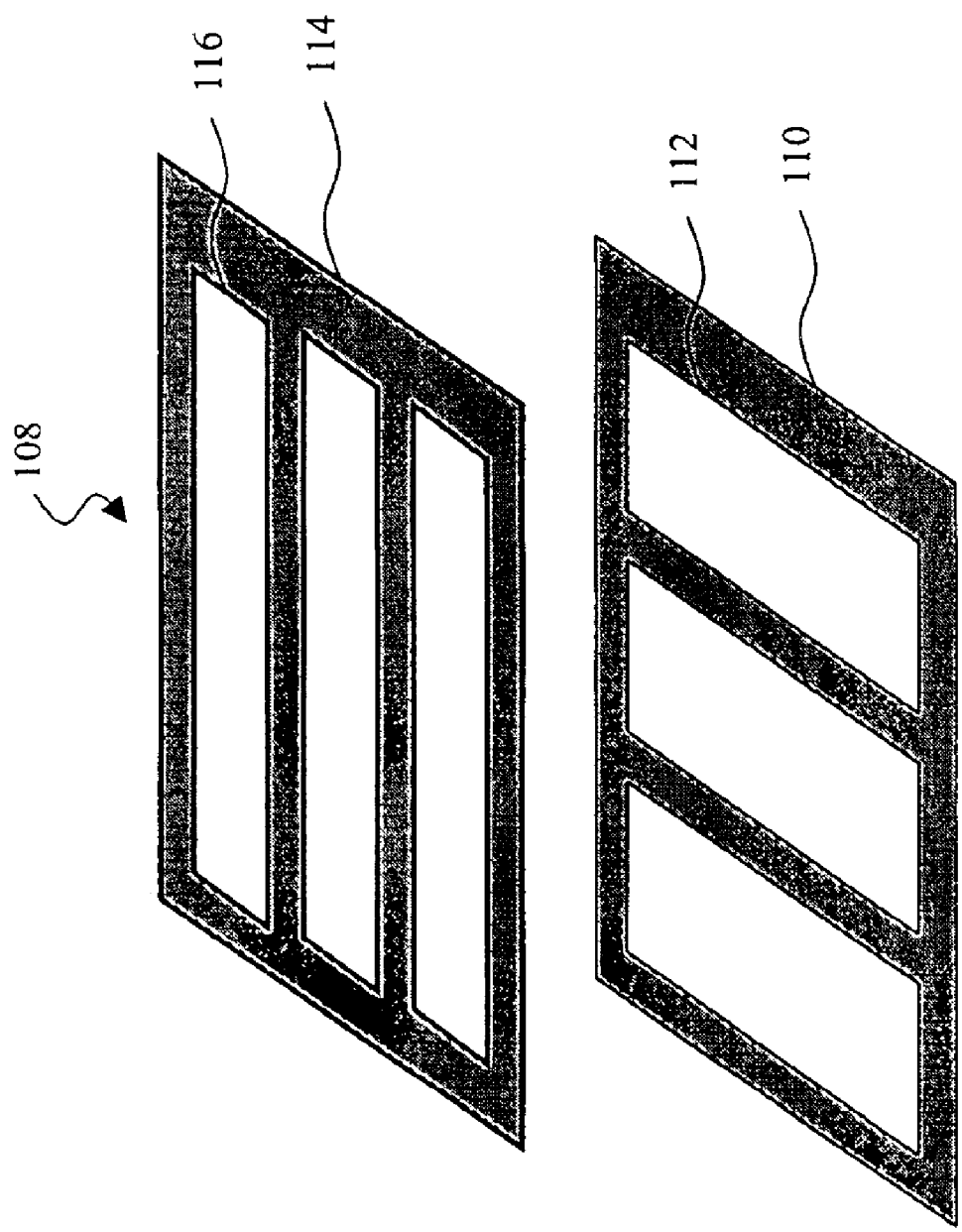
FIG. 3a illustrates one embodiment of multiple shielding layers that may be used in the RFIC of FIG. 2.
Figure 3B:
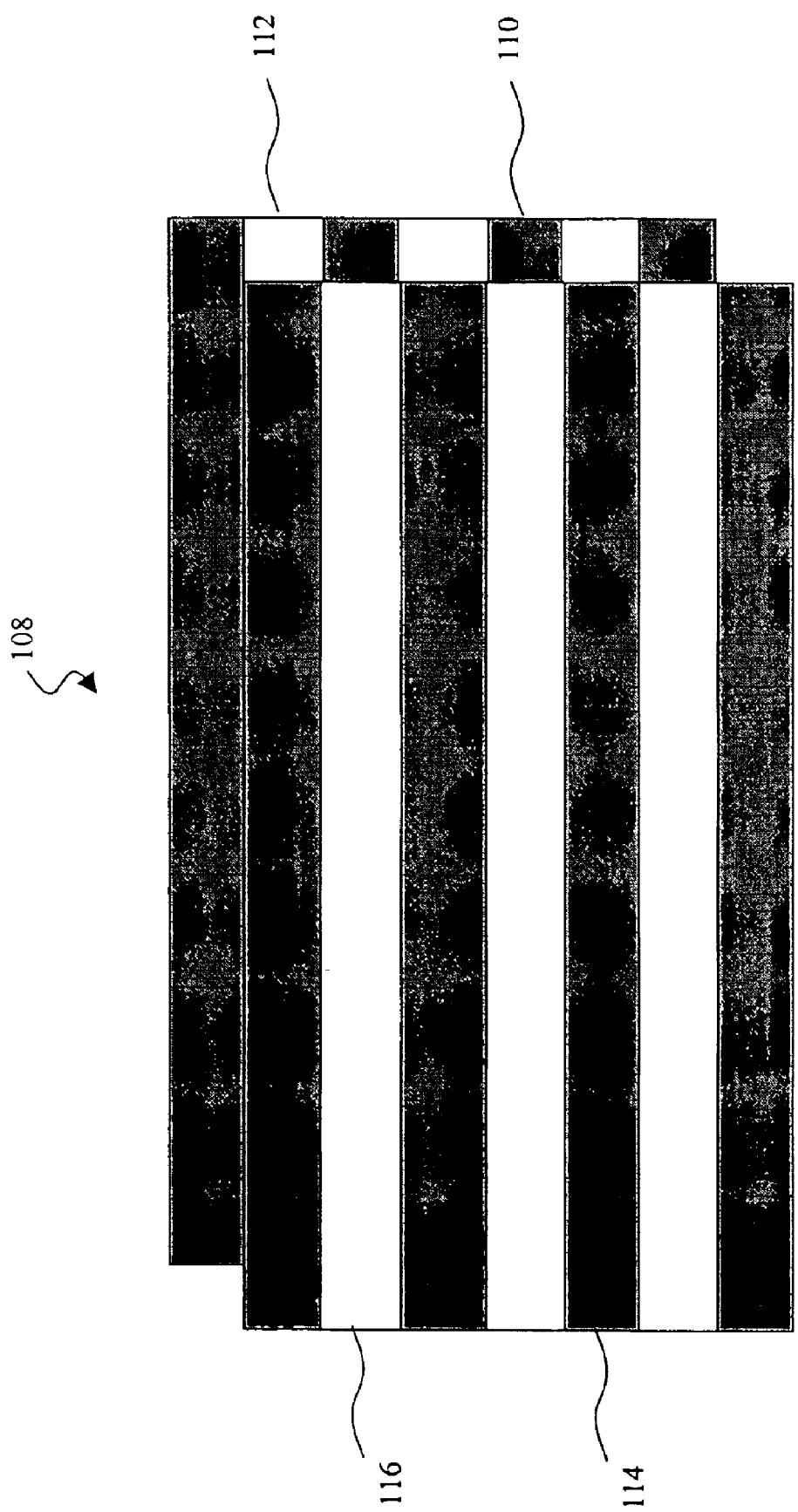
FIG. 3b illustrates another embodiment of multiple shielding layers that may be used in the RFIC of FIG. 2.

With additional reference to FIGS. 3a and 3b, the offset arrangement described with respect to FIG. 2 may be achieved in a variety of ways. For example, the offset arrangement may be designed with the openings 112, 116 in different orientations in their respective shielding layer (as illustrated in FIG. 3a), or the offset may be designed by offsetting the shielding layers 110, 114 themselves if the shielding layers have an identical arrangement of openings (as illustrated in FIG. 3b). It is also understood that each shielding layer may have no opening, or may have a single opening that is offset from an opening in another layer.

Figure 4:
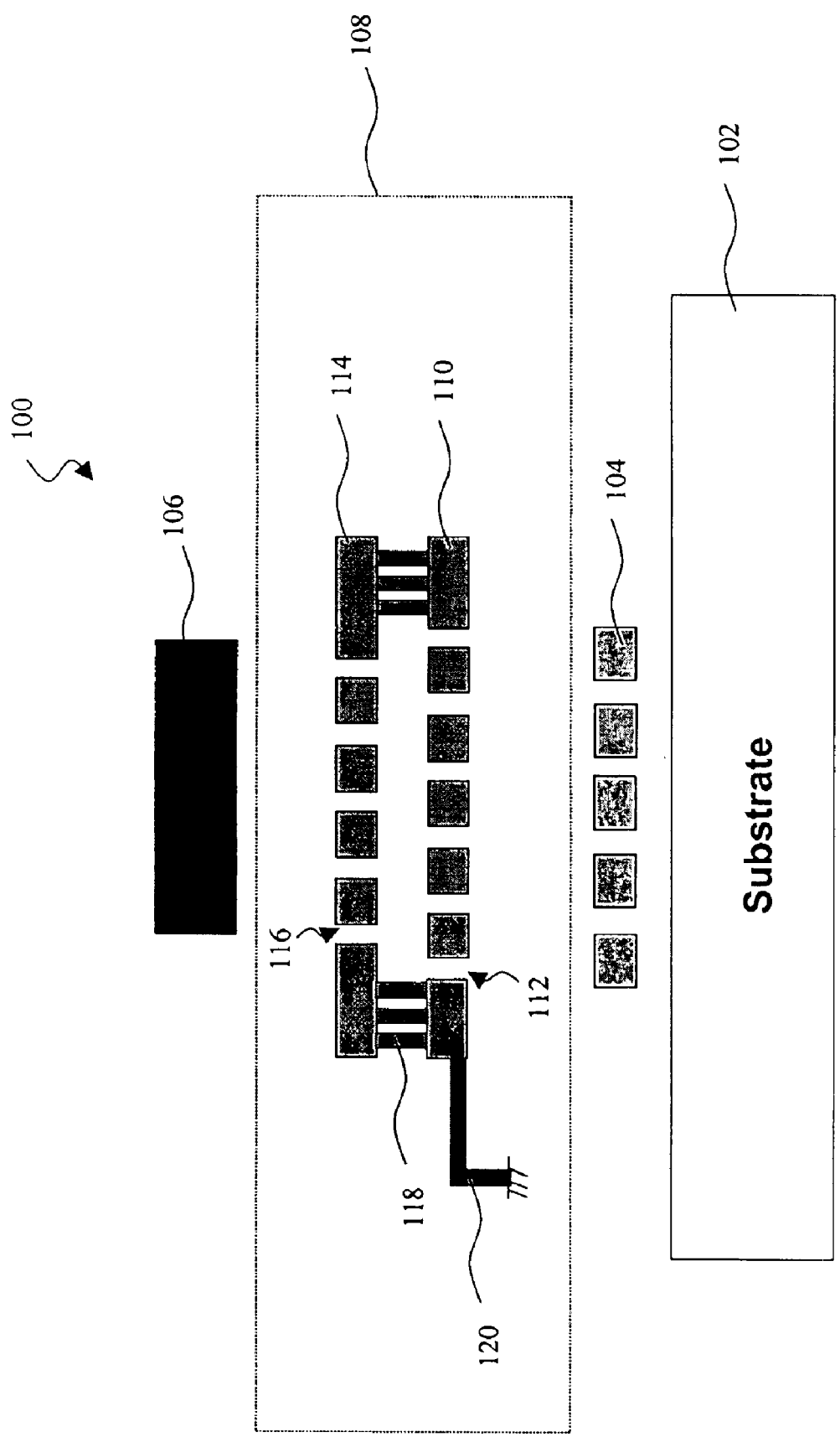
FIG. 4 illustrates a cross-sectional view of yet another embodiment of a RFIC having multiple shielding layers and a guard ring.
Figure 5:
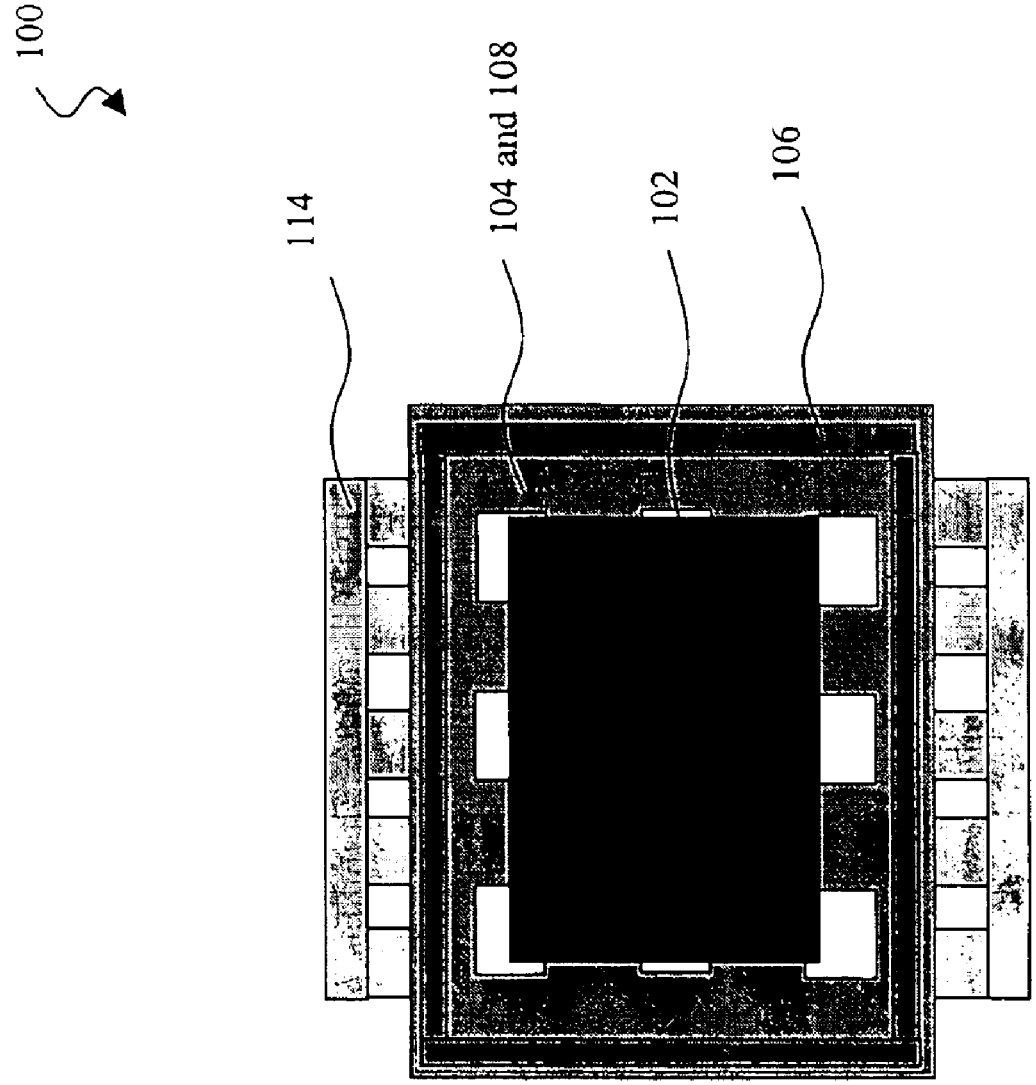
FIG. 5 illustrates a top view of the RFIC of FIG. 4.

Referring now to FIGS. 4 and 5, in still another embodiment, the RF shielding structure 108 of FIG. 2 is illustrated with a guard ring 118 and a grounding structure 120. The guard ring 118 connects the second shielding layer 114 and the first shielding layer 110. In the present example, the guard ring 118 is designed in a strip structure in which a plurality of strips are vertically positioned between the first and second shielding layers 110, 114, with each vertical strip connecting the two shielding layers. If additional shielding layers are present (not shown), the vertical strips forming the guard ring 118 may either extend through each shielding layer to contact other shielding layers, or a separate guard ring may be provided for each pair of shielding layers. It is understood that the guard ring 118 may be designed without the use of the vertical strips and is not limited to the illustrated example. The RF shielding structure 108 may be grounded by means of the grounding structure 120.

Figure 6:
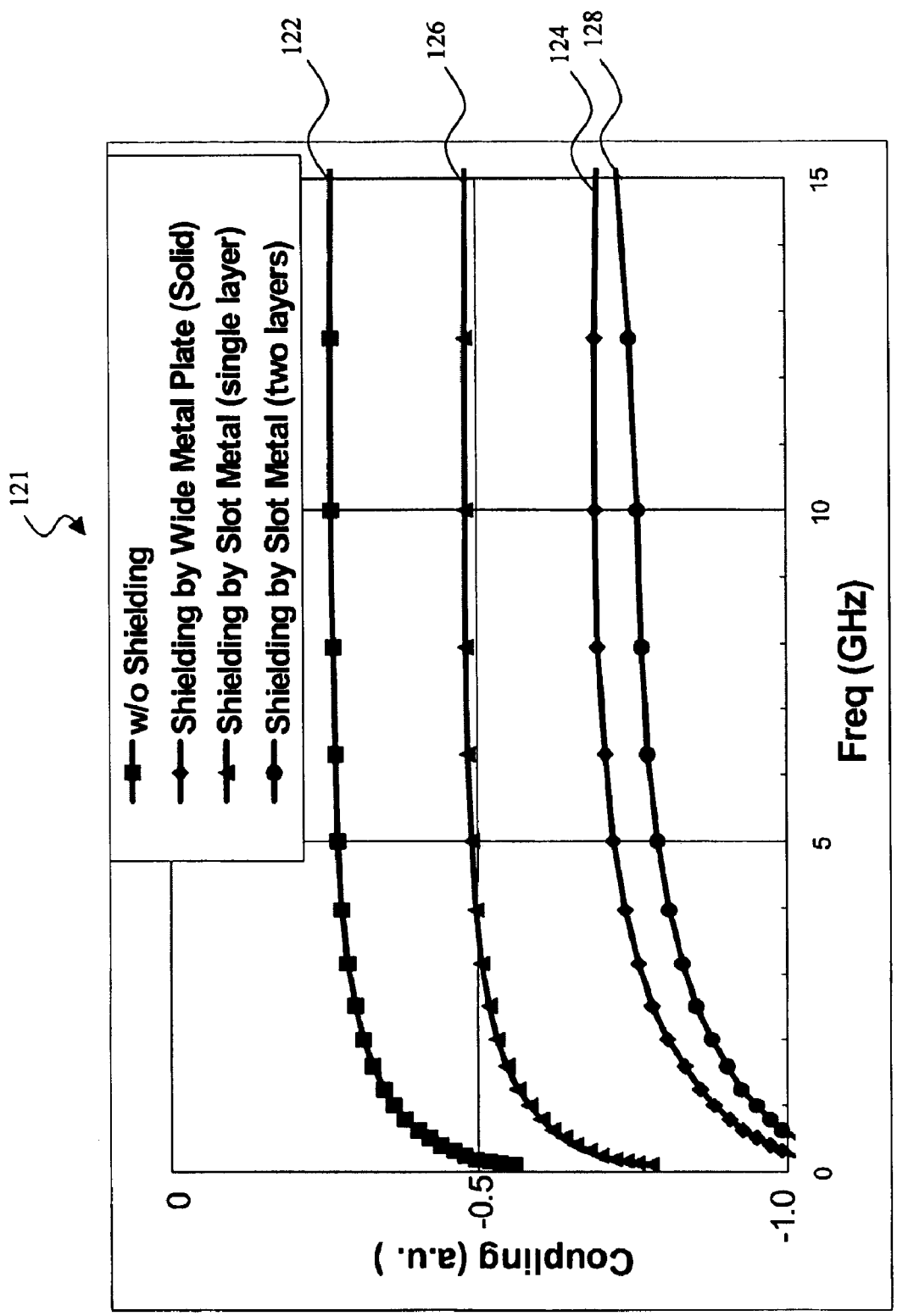
FIG. 6 is a chart illustrating a shielding efficiency provided by various embodiments of shielding layers.

Referring now to FIG. 6, a chart 121 illustrates a coupling interaction (and, therefore, a shielding efficiency) between a conductive routing layer and one or more RF passive components (e.g., the conductive routing 104 and RF passive components 106 of FIG. 1a). In the present example, the RF passive components 106 have been characterized in four situations, each of which is represented by one of four curves 122, 124, 126, and 128. Curve 122 represents the absence of shielding; curve 124 represents shielding using a single metal plate without any openings; curve 126 represents shielding using a single layer of metal having a slot opening; and curve 128 represents shielding using two layers, each of which has a slot opening arranged with the opening of the first layer offset from the opening of the second layer. For purposes of illustration, the coupling is evaluated by coupling power and drawn in an arbitrary unit versus frequency. From 0 to −1, the coupling power is from strong to weak. Accordingly, the coupling power is expected to be minimized or eliminated when a shielding structure is used. As shown in FIG. 6, the results illustrate that shielding efficiency increases using a single layer of metal having a slot opening (curve 126); increases again using a single metal plate without any openings (curve 124); and increases yet again using two layers having offset slot openings (curve 128). It is understood that various changes in the material, structure, thickness, number of openings, offset orientation, etc., may alter the results from those shown in FIG. 6.

Figure 7:
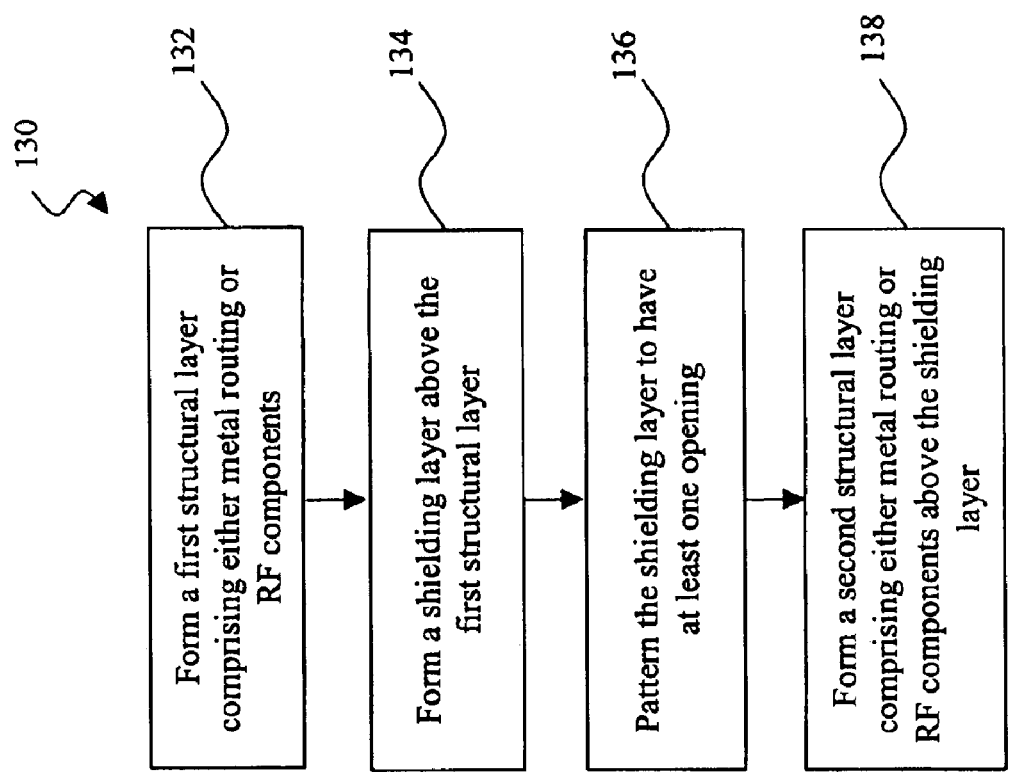
FIG. 7 is a flow chart of one embodiment of a method for fabricating a semiconductor device having at least one RF shielding layer.

Referring now to FIG. 7, in yet another embodiment, a method 130 illustrates an exemplary fabrication process that may be used to fabricate an RF shielding structure, such as the RF shielding structure 108 described above with respect to FIG. 1a. The method 130 begins in step 132 when a first structural layer is formed on a semiconductor substrate. The first structural layer may be a conductive layer, such as the conductive routing 104 (FIG. 1a) or may be a layer of other components, such as the RF passive components 106 (FIG. 1a).

In step 134, a shielding layer of conductive material is formed above the first structural layer. The conductive material may substantially include a metal or metal alloy, and may be formed using aluminum, aluminum alloy (Al—Cu—Si), titanium, titanium nitride, tantalum, tantalum nitride, doped polysilicon, or other suitable conductive materials. Furthermore, the conductive material may be deposited to form a structure that includes multiple layers. For example, titanium and titanium nitride may be used to provide a barrier layer for an Al—Cu—Si alloy layer. The deposition may be accomplished using processes such as a physical vapor deposition (PVD) process, including evaporation and sputtering, a plating process, including electroless plating or electroplating, or a chemical vapor deposition (CVD) process, including atmospheric pressure CVD (APCVD), low pressure CVD (LPCVD), plasma enhanced CVD (PECVD), or high density plasma CVD (HDP CVD). For example, sputtering may be used to deposit the Al—Cu—Si alloy film as the shielding layer.

In step 136, the shielding layer may be patterned to produce a predetermined arrangement of openings in the shielding layer. In the present example, a conventional lithography process may be used, but it is understood that other processes may be used to produce the same or similar results. For purposes of illustration, a process flow may include forming a photoresist layer on the shielding layer by spin-on coating, baking the photoresist layer, exposing the photoresist layer to light through a photomask, developing the photoresist layer, and putting the developed photoresist layer through a post-bake process. This process flow transfers the pattern of openings for the shielding layer from the photomask to the photoresist. The exposed portion of the shielding layer may then be removed, which transfers the pattern from the photoresist to the shielding layer. The removal process may include dry etching, wet etching, reactive ion etching (RIE), or other suitable processes. The photoresist may then be stripped by wet stripping or plasma ashing.

In step 138, a second structural layer may be formed above the patterned shielding layer. The second structural layer may be a conductive layer, such as the conductive routing 104 (FIG. 1a) or may be a layer of other components, such as the RF passive components 106 (FIG. 1a). In the present example, the first structural layer is a conductive routing layer and the second structural layer is a layer of RF passive components. The method 130 positions the shielding layer between the first and second structural layers to minimize noise coupling.

Figure 8:
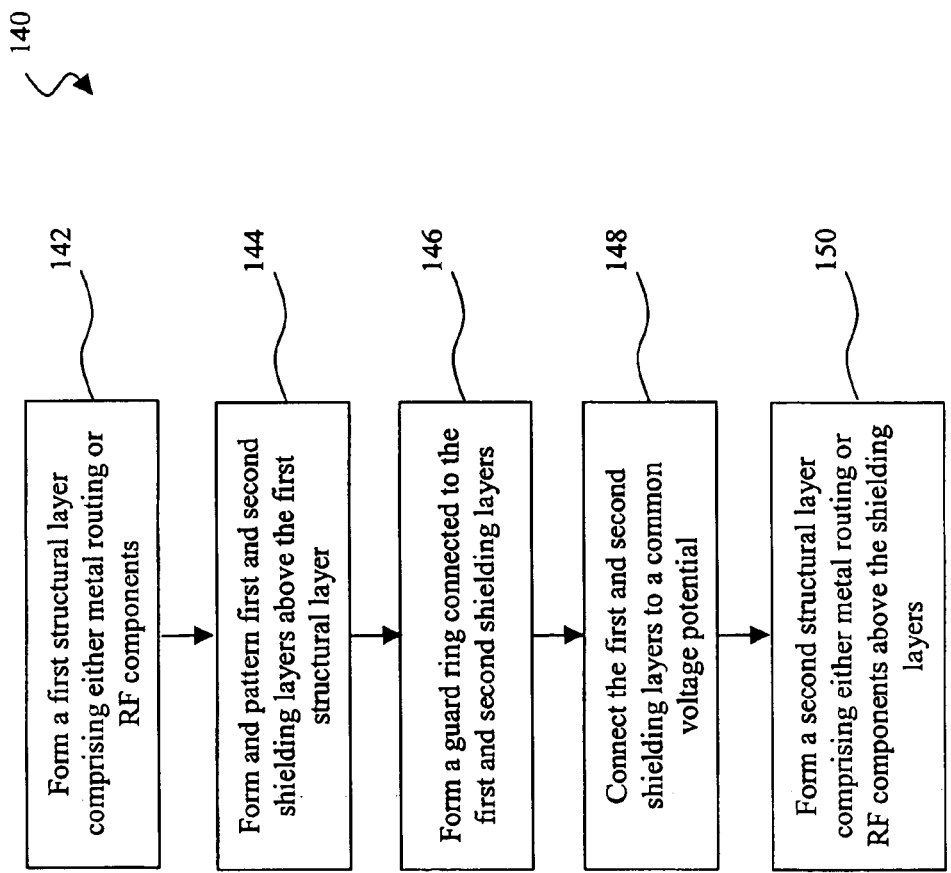
FIG. 8 is a flow chart of another embodiment of a method for fabricating a semiconductor device having at least one RF shielding layer.

Referring now to FIG. 8, in another embodiment, a method 140 illustrates an exemplary fabrication process that may be used to fabricate an RF shielding structure, such as the RF shielding structure 108 described above with respect to FIG. 4. The method 140 begins in step 142 when a first structural layer is formed on a semiconductor substrate. The first structural layer may be a conductive layer, such as the conductive routing 104 (FIG. 1a) or may be a layer of other components, such as the RF passive components 106 (FIG. 1a).

In step 144, first and second shielding layers may be formed and patterned to form a multi-level shielding layer. Although the shielding layers may be deposited and patterned as described with respect to the method 130 of FIG. 7, in the present example they are formed using a damascene or dual damascene process as follows. To accomplish this, a dielectric material may be deposited above the first structural layer using a spin-on process, thermal or RTP oxidation, APCVD, LPCVD, PECVD, and HDP CVD. The dielectric material may include silicon oxide, silicon carbide, fluorine-doped silicate glass (FSG), hydrogen silsesquioxane (HSQ), organic polymer, or black diamond.

A photoresist layer may then be applied to the dielectric layer and patterned based on a predetermined arrangement of openings. For example, a process flow may include patterning a photoresist layer by transferring a pattern from a photomask using a plurality of steps such as spinning, soft baking, exposing, developing, and hard baking. The exposed portion of the dielectric layer may then be removed and a trench structure may be formed. In this processing, the pattern may be transferred from the photoresist to the dielectric layer through dry etching, wet etching or RIE. The photoresist may then be stripped using a wet stripping or plasma ashing process.

A layer of conductive material may then be formed in the trench structure using conventional deposition processes. The conductive material may substantially include copper, copper alloy, aluminum, aluminum alloy (Al—Cu—Si), titanium, titanium nitride, tantalum, tantalum nitride, tungsten, tungsten nitride, doped polysilicon, or similar suitable materials. As previously described, the structure of the conductive material may include multiple layers, such as using titanium and titanium nitride barrier layers with a copper layer. A variety of deposition processes may be used, including PVD, CVD, or plating. In the present example, sputtering is used to deposit barrier layers that include titanium and titanium nitride, and a copper seed layer, and then electroplating deposition may be used to further deposit a copper layer. Accordingly, copper is formed inside the trench and above the dielectric layer. Excess conductive material above the dielectric layer may then be removed by a process such as etching back or CMP. This process may be repeated to form additional shielding layers.

It is understood that other conductive layers may be deposited in a similar manner. As described previously, the arrangement of openings in the other conductive layers may be offset to present a solid shield when viewed from a vertical perspective. For example, the same photomask may be used but repositioned to provide the offset, or a different photomask may be used to pattern different conductive layers.

In step 146, a guard ring may be formed and connected to the first and second shielding layers. For purposes of illustration, the guard ring may be fabricated using known methods for fabricating a metal via or contact, such as dielectric layer deposition, via patterning, and filling the pattern with a conductive material such as copper, copper alloy, aluminum, aluminum alloy (Al—Cu—Si), titanium, titanium nitride, tantalum, tantalum nitride, tungsten, metal silicide, doped polysilicon, or carbon nanotube. In some embodiments, the fabrication of the guard ring and one of the first and second shielding layers may be combined into one process. For example, a dielectric layer may be deposited, one or more vias patterned and etched, a conductive material used to fill the vias above the dielectric layer, and then the shielding layer may be patterned to create the arrangement of openings. Accordingly, while the formation of the guard ring is illustrated in step 146 following the formation of the first and second shielding layers in step 144, it may also occur prior to or simultaneously with step 144.

In step 148, the first and second shielding layers may be connected to a common voltage potential (e.g., ground). This may also occur during the formation of the first and second shielding layers and/or the guard ring.

In step 150, a second structural layer may be formed above the shielding layers. The second structural layer may be a conductive layer, such as the conductive routing 104 (FIG. 1a) or may be a layer of other components, such as the RF passive components 106 (FIG. 1a). In the present example, the first structural layer is a conductive routing layer and the second structural layer is a layer of RF passive components, although it is understood that these may be reversed. The method 140 positions the shielding layers with their offset openings between the first and second structural layers to minimize noise coupling.

The present disclosure has been described relative to a preferred embodiment. Improvements or modifications that become apparent to persons of ordinary skill in the art only after reading this disclosure deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor device having a substrate, the device comprising:
   an active circuit layer formed proximate to the semiconductor substrate;
   a component layer comprising at least one radio frequency (RF) passive component formed therein; and
   a first shielding layer positioned between the active circuit layer and the component layer, wherein the first shielding layer includes at least a first opening formed therein.

2. The semiconductor device of claim 1 further comprising a second shielding layer positioned between the active circuit layer and the component layer.

3. The semiconductor device of claim 2 further comprising a guard ring connected to both the first and second shielding layers.

4. The semiconductor device of claim 3 wherein the guard ring comprises a via strip.

5. The semiconductor device of claim 4, wherein at least one of the first shielding layer, the second shielding layer, and the guard ring is made from a highly conductive material.

6. The semiconductor device of claim 5, wherein the highly conductive material is selected from a group consisting of copper, aluminum, polycrystalline silicon, tungsten, metal silicide, and combinations thereof.

7. The semiconductor device of claim 2, wherein at least one of the first and second shielding layers is grounded or connected to a fixed voltage potential.

8. The semiconductor device of claim 2 wherein the second shielding layer includes at least a second opening formed therein.

9. The semiconductor device of claim 8, wherein the second opening is offset from the first opening.

10. The semiconductor device of claim 8 wherein at least one of the first opening and the second opening is a slot.

11. The semiconductor device of claim 10 wherein an orientation of the first opening differs from an orientation of the second opening.

12. The semiconductor device of claim 8 wherein at least one of the first opening and the second opening is a hole.

13. The semiconductor device of claim 1 wherein the at least one RF passive component comprises a capacitor, a resistor, an inductor, or combinations thereof.

14. The semiconductor device of claim 1 wherein the substrate comprises an elemental semiconductor.

15. The semiconductor device of claim 1 wherein the substrate comprises a compound semiconductor.

16. The semiconductor device of claim 1 wherein the substrate comprises an alloy semiconductor.

17. The semiconductor device of claim 1 wherein the substrate is selected from a group consisting of a metal-oxide-semiconductor field effect transistor, a bipolar transistor, a capacitor, a resistor, an inductor, and combinations thereof.

18. The semiconductor device of claim 1 wherein the active circuit layer comprises an interconnection structure.

19. The semiconductor device of claim 18 wherein the interconnection structure is made from a material selected from the group consisting of copper, aluminum, polycrystalline silicon, tungsten, metal silicide, and combinations thereof.

20. A shielding structure for a radio frequency integrated circuit (RFIC), wherein the RFIC includes a first structural layer having at least one RF passive component and a second structural layer having routing for active components, the shielding structure comprising:
   a first conductive shielding layer positioned between the first and second structural layers, wherein the first conductive layer has at least one opening formed therein;
   a second conductive shielding layer positioned between the first and second structural layers and proximate to the first conductive shielding layer, wherein the second conductive shielding layer has a second opening formed therein; and
   a guard ring connected to the first and second conductive shielding layers, wherein the first and second conductive shielding layers are connected to a common voltage potential.

21. The shielding structure of claim 20 wherein the first opening is offset from the second opening.

22. A method for providing shielding in an integrated circuit formed on a substrate, the method comprising:

forming a first structural layer on the substrate, wherein the first structural layer comprises either metal routing or radio frequency passive (RF) components;

forming a first shielding layer above the first structural layer;

patterning the first shielding layer to form at least one opening in the first shielding layer; and forming a second structural layer above the first shielding layer, wherein the second structural layer comprises RF passive components if the first structural layer comprises metal routing, and wherein the second structural layer comprises metal routing if the first structural layer comprises RF passive components.

23. The method of claim 22 further comprising:

forming a second shielding layer proximate to the first shielding layer; and patterning the second shielding layer to form at least one opening in the second shielding layer.

24. The method of claim 23 wherein patterning the second shielding layer includes offsetting the second opening from the first opening.

25. The method of claim 23 further comprising connecting at least one of the first and second shielding layers to a common voltage potential.

26. The method of claim 25 further comprising forming a guard ring to connect the first and second shielding layers.

27. A semiconductor device having a substrate, the device comprising:

a metal routing layer for an active circuit formed proximate to the substrate;

a radio frequency (RF) layer having at least one RF component formed therein; and a first metal shielding layer positioned between the routing layer and the RF layer, wherein the first metal shielding layer has a first opening formed therein.

28. The semiconductor device of claim 27 further comprising a second shielding layer positioned between the metal routing layer and the RF layer.

29. The semiconductor device of claim 28 further comprising a guard ring connecting the first and second metal shielding layers.

* * * * *